US010418898B2

(12) United States Patent
Cho et al.

(10) Patent No.: US 10,418,898 B2
(45) Date of Patent: Sep. 17, 2019

(54) SWITCH MODE POWER SUPPLY USING A RECONFIGURABLE DELTA-SIGMA MODULATOR AND METHOD OF DRIVING THE SAME

(71) Applicant: ELECTRONICS AND TELECOMMUNICATIONS RESEARCH INSTITUTE, Daejeon (KR)

(72) Inventors: Young Kyun Cho, Daejeon (KR); Myung Don Kim, Daejeon (KR); Seok Bong Hyun, Daejeon (KR); Bong Hyuk Park, Daejeon (KR); Cheol Ho Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/030,929

(22) Filed: Jul. 10, 2018

(65) Prior Publication Data
US 2019/0028027 A1 Jan. 24, 2019

(30) Foreign Application Priority Data
Jul. 18, 2017 (KR) ........................ 10-2017-0090959

(51) Int. Cl.
*H02M 3/157* (2006.01)
*H02M 3/158* (2006.01)
(Continued)

(52) U.S. Cl.
CPC ............ *H02M 3/157* (2013.01); *H02M 1/08* (2013.01); *H02M 1/143* (2013.01); *H02M 1/44* (2013.01);
(Continued)

(58) Field of Classification Search
None
See application file for complete search history.

(56) References Cited

U.S. PATENT DOCUMENTS 6,653,960 B2   11/2003   Mitamura et al.
6,984,967 B2   1/2006    Notman
(Continued)

FOREIGN PATENT DOCUMENTS

EP   1239575 A2 *   9/2002   ............ H02M 3/156

OTHER PUBLICATIONS

Anabtawi, Nijad et al., An All-Digital Fast Tracking Switching Converter with a Programmable Order Loop Controller for Envelope Tracking RF Power Amplifiers, 2016 IEEE International Symposium on Circuits and Systems (ISCAS) May 2016, IEEE (Year: 2016).*

(Continued)

*Primary Examiner* — Howard Williams
(74) *Attorney, Agent, or Firm* — Rabin & Berdo, P.C.

(57) ABSTRACT

The present disclosure a switched-mode power supply using a reconfigurable delta-signal modulator (DSM). The switched-mode power supply comprises, a current sensing unit configured to determine an operation mode on the basis of a result of sensing a current of an output terminal; a compensator configured to output a compensation signal by amplifying a difference value between an output voltage and a reference voltage; a reconfigurable DSM configured to output a digital signal by noise-shaping the compensation signal; a power switch unit switched by the digital signal to output an output voltage; and an attenuator configured to supply a feedback voltage of the output voltage attenuated by a voltage divider to the compensator.

20 Claims, 8 Drawing Sheets

(51) Int. Cl.
*H03M 3/00* (2006.01)
*H02M 1/08* (2006.01)
*H02M 1/14* (2006.01)
*H02M 1/44* (2007.01)
*H02M 1/00* (2006.01)

(52) U.S. Cl.
CPC ........... *H02M 3/158* (2013.01); *H03M 3/454* (2013.01); *H02M 2001/0009* (2013.01); *H02M 2001/0032* (2013.01); *H02M 2001/0054* (2013.01)

(56) References Cited

U.S. PATENT DOCUMENTS

| | | | |
|---|---|---|---|
| 7,545,130 B2 | 6/2009 | Latham | |
| 7,652,604 B2 | 1/2010 | Parayandeh et al. | |
| 7,759,921 B2 | 7/2010 | Prodic | |
| 7,773,016 B2 | 8/2010 | Miao | |
| 8,018,743 B2 | 9/2011 | Wang et al. | |
| 8,754,599 B2 * | 6/2014 | Sasaki | H03M 3/494 323/283 |
| 8,791,846 B2 | 7/2014 | Cho et al. | |
| 8,928,301 B2 | 1/2015 | Schubert | |
| 9,014,281 B2 | 4/2015 | Cho et al. | |
| 9,281,745 B2 | 3/2016 | Zoso et al. | |
| 2008/0204290 A1 * | 8/2008 | Parayandeh | H02M 3/157 341/143 |
| 2015/0349768 A1 * | 12/2015 | Thiagarajan | H03K 17/00 307/109 |

OTHER PUBLICATIONS

Steven K. Dunlap et al., "A Noise-Shaped Switching Power Supply Using a delta-sigma modulator", IEEE Transactions on Circuits and Systems-I: Regular Papers, vol. 51, No. 6, Jun. 2004, pp. 1051-1061.

Wei Yan et al., "A Noise-Shaped Buck DC-DC Converter With Improved Light-Load Efficiency and Fast Transient Response", IEEE Transactions on Power Electronics, vol. 26, No. 12, Dec. 2011, pp. 3908-3924.

Mohammad K. Alghamdi et al., "A Spurious-Free Switching Buck Converter Achieving Enhanced Light-Load Efficiency by Using a ΔΣ-Modulator Controller With a Scalable Sampling Frequency", IEEE Journal of Solid-State Circuits, vol. 47, No. 4, Apr. 2012, pp. 841-851.

* cited by examiner

CCM MODE

DCM MODE

SWITCH MODE POWER SUPPLY USING A RECONFIGURABLE DELTA-SIGMA MODULATOR AND METHOD OF DRIVING THE SAME

CROSS-REFERENCE TO RELATED APPLICATIONS

This application claims priorities to Korean Patent Applications No. 10-2017-0090959 filed on Jul. 18, 2017 in the Korean Intellectual Property Office (KIPO), the entire contents of which are hereby incorporated by reference.

BACKGROUND

1. Technical Field

Example embodiments of the present invention relate in general to a switched-mode power supply, and more specifically, to a switched-mode power supply using a reconfigurable delta-sigma modulator (DSM) in which a DSM operates in multi-modes using an order-convertible loop filter, and a method of driving the same.

2. Related Art

For communication systems, a direct current (DC)-DC converter is employed in order to increase a service life while reducing a size and weight, and a pulse width modulation (PWM) method and a pulse frequency modulation (PFM) method are employed in order to obtain a high energy conversion efficiency in a wide range of load currents.

In the case of the PWM method and the PFM method, periodical ripple voltages are generated at switching frequencies by a processor used for DC-DC conversion. That is, an output spectrum of a DC-DC converter causes a strong output spike at an integer multiple order frequency of a switching frequency, and such a switching harmonic is coupled to a load through a power line, thereby degrading the performance of the system. In order to remove the switching harmonic, an electromagnetic interference (EMI) filter is needed and thus the manufacturing cost of the DC-DC converter is increased. In order to solve these constraints, spectrum spread methods have been suggested, but the spectrum spread methods produce an output voltage having a large ripple.

In order to improve the shortcoming of the PWM method or the PFM method, a delta-sigma modulation method has been developed. The delta-sigma modulation method is an analog-to-digital conversion or digital-to-analog conversion method derived from delta modulation, and due to its anti-aliasing characteristic and a high signal to noise ratio (SNR) characteristic, is used to enhance the efficiency of wireless communication systems, such as Long-Term Evolution (LTE) of 3rd generation partnership project (3GPP) or worldwide interoperability for microwave access (WiMAX).

A delta-sigma modulator (DSM) used at a receiving end of a receiving system is applied in various uses due to noise shaping characteristics. However, due to a complicated design and difficulty in maintaining stability, the modulator operates under a limited condition of a single signal bandwidth and clock frequency. For example, a Global System for Mobile Communication (GSM) requiring a high SNR in a narrow bandwidth and a Universal Mobile Telecommunications System (UMTS) requiring a medium SNR in a wide signal bandwidth use different DSMs having different structures and orders. As such, since different modulators need to be implemented according to a system, the size and power consumption of the system are increased.

Meanwhile, the quality of noise shaping is improved in proportion to the order of the DSM, but the stability of the system is lowered due to an increase in the order of the DSM. Accordingly, when a second-order DSM is used for a DC-DC converter, the second-order DSM has a limitation in removing switching harmonics. That is, the switching harmonic may be removed by increasing the order of the DSM, but the stability of the system is degraded with the increase in the order of DSM. In contrast, the stability of the system may be increased by lowering the order of the DSM, but the performance of removing switching harmonics is degraded.

SUMMARY

Accordingly, example embodiments of the present invention are provided to substantially obviate one or more problems due to limitations and disadvantages of the related art.

Example embodiments of the present invention provide a switched-mode power supply using a reconfigurable DSM, which is capable of operating in a wide range of load currents by driving power switches using a reconfigurable DSM, and a method of driving the same.

Example embodiments of the present invention provide a switched-mode power supply using a reconfigurable DSM, in which a second-order loop filter DSM may be used for a light load (a low load) current and a third-order loop filter DSM may be used for a heavy load (a high load) current according to a change in the load current in order to increase the stability and power efficiency of the entire loop of a DC-DC converter, and a method of driving the same.

Example embodiments of the present invention provide a switched-mode power supply using a reconfigurable DSM, which is capable of reducing an output voltage ripple across the entire range of loads (light load current, medium load current, and heavy load current) by changing a sampling frequency and an order of the DSM according to a current value of an output terminal (an inductor), and a method of driving the same.

Example embodiments of the present invention provide a switched-mode power supply using a reconfigurable DSM, which is capable of operating in a wide range of sampling frequencies by reconfiguring a second-order loop filter or a third-order loop filter using a single operational amplifier resonating circuit, and a method of driving the same.

Example embodiments of the present invention provide a DSM capable of changing an order of a loop filter by adding switches inside an RC circuit of the loop filter and controlling the switches to be turned ON/OFF.

Example embodiments of the present invention provide a switched-mode power supply using a reconfigurable DSM, in which different transfer functions are applied to a compensator according to an operation mode of the DSM, and a method of driving the same.

Example embodiments of the present invention provide a switched-mode power supply using a reconfigurable DSM, in which different transfer functions are applied depending on a continuous conduction mode (CCM) or a discontinuous conduction mode (DCM) such that stable loop characteristics can be obtained, and a method of driving the same.

In order to achieve the objective of the present disclosure a switched-mode power supply using a reconfigurable delta-signal modulator (DSM). The switched-mode power supply comprises, a current sensing unit configured to determine an operation mode on the basis of a result of sensing a current of an output terminal; a compensator configured to output a compensation signal by amplifying a difference value between an output voltage and a reference voltage; a reconfigurable DSM configured to output a digital signal by noise-shaping the compensation signal; a power switch unit switched by the digital signal to output an output voltage; and an attenuator configured to supply a feedback voltage of the output voltage attenuated by a voltage divider to the compensator. The reconfigurable DSM changes an order of a loop filter according to a magnitude of a load current.

The reconfigurable DSM is configured to, operate such that the order of the loop filter is set to a second order when the load current is a first load current smaller than a reference value; operate such that the order of the loop filter is set to the second order or a third order when the load current is a second load current larger than the first load current; and operate such that the order of the loop filter is set to the third order when the load current is a third load current larger than the second load current.

The reconfigurable DSM is configured to, use a first sampling frequency for the first load current; use a second sampling frequency higher than the first sampling frequency for the second load current; and use a third sampling frequency higher than the second sampling frequency for the third load current.

The current sensing unit is configured to, determine a discontinuous conduction mode (DCM) compensation when the sensed current is the first load current smaller than the reference value; determine a continuous conduction mode (CCM) compensation or the DCM compensation when the sensed current is the second load current corresponding to the reference value; and determine the CCM compensation when the sensed current is the third load current larger than the reference value.

The compensator is configured to, perform the DCM compensation in response to the first load current; perform the DCM compensation or the CCM compensator in response to the second load current; and perform the CCM compensator in response to the third load current.

The loop filter comprises, a first integrator, a second integrator, and a third integrator which are connected in series; a first switch disposed parallel to the first integrator; and a second switch disposed on a loop for feedforwarding an output of the first integrator to an output of the third integrator.

When the order of the loop filter is set to the third order, a transfer function TF3 having three poles and two zeros is derived.

When the order of the loop filter is set to the third order, an output coefficient of the first integrator is fed forward to be summed with outputs of the second and the third integrators, and a final output is fed back to be subtracted from the output of the first integrator.

A third-order loop filter is converted into a second-order loop filter by turning on the first switch to remove the first integrator and turning off the second switch to remove the loop for feedforwarding.

When the order of the loop filter is set to the second order, the loop filter is configured with two integrators, one feedforward loop, and one feedback loop, and a transfer function having two poles and one zero is derived.

The loop filter includes, a first capacitor, a second capacitor, and third capacitors which are connected in series; an operational amplifier connected parallel to the first to third capacitors; a first inverting circuit configured to inverse and output a signal of an input terminal; a second inverting circuit configured to inverse and output an output signal of the operational amplifier; a first resistor arranged between the input terminal and a first terminal of the first capacitor; a second resistor having a first terminal connected to a first node formed between the first capacitor and the second capacitor and a second terminal connected to a ground; a third resistor having a first terminal connected to a second node formed between the second capacitor and the third capacitor and a second terminal connected to the ground; a fourth resistor having a first terminal connected to the first node and a second terminal connected to an output terminal of the operational amplifier; a fifth resistor connected parallel to the third capacitor; a sixth resistor having a first terminal connected to an output terminal of the first inverting circuit and a second terminal connected to the first node; a seventh resistor having a first terminal connected to a third node and a second terminal connected to the second node; a first switch arranged between the second terminal of the sixth resistor and the first node; a second switch arranged between the seventh resistor and the second node; a third switch connected parallel to the first capacitor; and a fourth switch arranged between the second resistor and the first node.

The loop filter operates as a third-order loop filter by turning on the first switch, the second switch, and the fourth switch and turning off the third switch.

The loop filter operates as a second-order loop filter by turning off the first switch, the second switch, and the fourth switch and turning on the third switch.

The compensator comprises, an operational amplifier including a first input terminal (−) and a second input terminal (+); a first resistor having a first terminal connected to a feedback input terminal and a second terminal connected to the first input terminal of the operational amplifier; a first capacitor having a first terminal connected to the feedback input terminal and a second terminal connected to the first input terminal of the operational amplifier; a first switch arranged between the feedback input terminal and the first capacitor; a second resistor connected in series to the first resistor and the first capacitor; a third resistor connected in series to the second resistor; a second switch connected parallel to the third resistor; and a second capacitor having a first terminal connected to the third resistor and a second terminal connected to an output terminal of the operational amplifier.

The compensator operates in a CCM by turning on the first and second switches.

The compensator operates in a DCM by turning off the first and second switches.

In order to achieve the objective of the present disclosure a driving method performed in a switched-mode power supply. The driving method comprises, compensating for a signal in a continuous conduction mode (CCM) or a discontinuous conduction mode (DCM) according to a magnitude of a load current, and outputting a compensation signal; changing an order of a loop filter according to the magnitude of load current; and outputting a digital signal obtained by noise-shaping the compensation signal using the loop filter; and outputting an output voltage on the basis of the digital signal.

The order of the loop filter is set to a second order when the load current is a first load current smaller than a reference value. The order of the loop filter is set to a second order or third order when the load current is a second load current larger than the first load current. And, the order of the loop filter is set to the third order when the load current is a third load current larger than the second load current.

A first sampling frequency is used for the first load current. A second sampling frequency higher than the first sampling frequency is used for the second load current, And, a third sampling frequency higher than the second sampling frequency is used for the third load current.

A DCM compensation is used in response to the first load current. The DCM or a CCM compensation is used in response to the second load current. And, the CCM compensation is used in response to the third load current.

As is apparent from the disclosure, the switched-mode power supply using a reconfigurable DSM according to the embodiments of the present invention and the method of driving the same can increase the range of operable load currents by driving the power switch with the output of the reconfigurable DSM.

In addition, the stability and power efficiency of the entire loop of the DC-DC converter can be increased by employing a second-order loop filter DSM for the light load (low load) current and a third-order loop filter DSM for the heavy load (high load) current according to the change in the load current.

In addition, the output voltage ripple across the entire range of loads (light load current, medium load current, and heavy load current) can be reduced by changing the sampling frequency and order of the DSM according to the current value of the output terminal (the inductor).

In addition, operation in a wide range of sampling frequencies can be secured by reconfiguring a second-order loop filter or a third-order loop filter using a single operational amplifier resonating circuit.

In addition, switches are added inside the RC circuit of the loop filter, and the switches are controlled to be turned ON/OFF so as to change the order of the loop filter.

In addition, different transfer functions are applied to the compensator according to the operation mode of the DSM, and different transfer functions are applied depending on a CCM or a DCM such that stable loop characteristics can be obtained.

BRIEF DESCRIPTION OF DRAWINGS

Embodiments of the present disclosure will become more apparent by describing in detail embodiments of the present disclosure with reference to the accompanying drawings, in which.

DESCRIPTION OF EXAMPLE EMBODIMENTS

Figure 1:
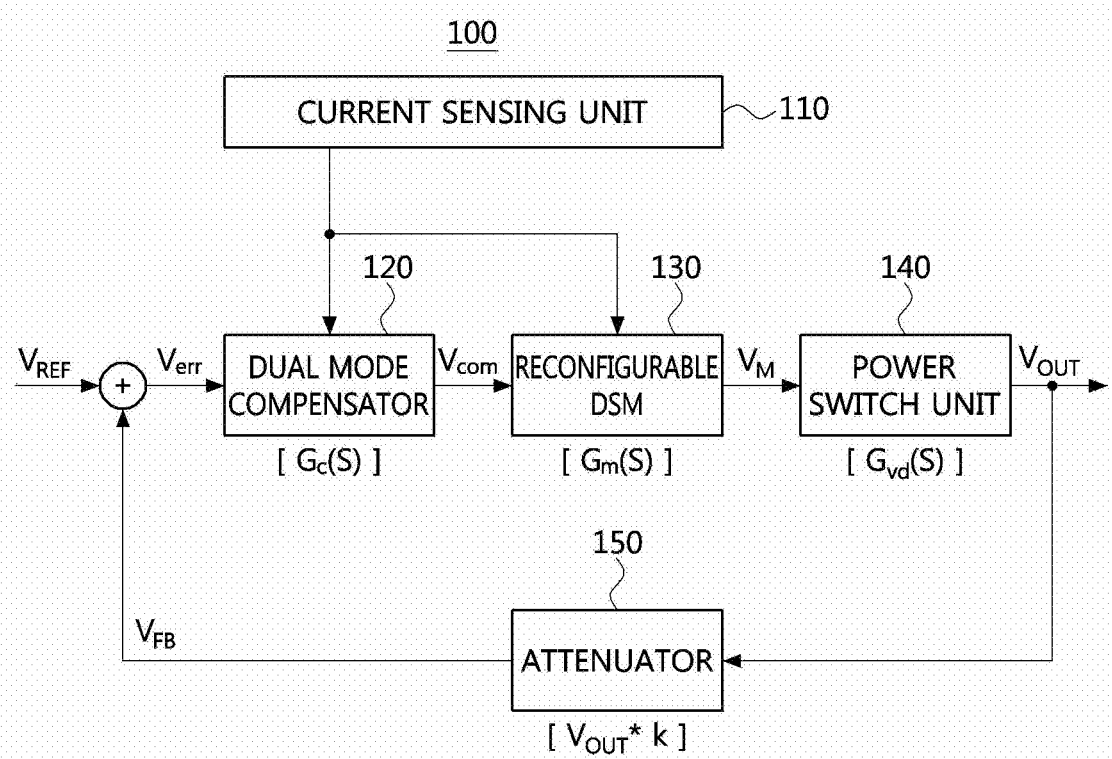
FIG. 1 is a block diagram illustrating a switched-mode power supply using a reconfigurable delta-sigma modulator (DSM) according to an example embodiment of the present invention.

Embodiments of the present disclosure are disclosed herein. However, specific structural and functional details disclosed herein are merely representative for purposes of describing embodiments of the present disclosure, however, embodiments of the present disclosure may be embodied in many alternate forms and should not be construed as limited to embodiments of the present disclosure set forth herein.

Accordingly, while the present disclosure is susceptible to various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in greater detail with reference to the accompanying drawings. In order to facilitate general understanding in describing the present disclosure, the same components in the drawings are denoted with the same reference signs, and repeated description thereof will be omitted.

FIG. 1 is a block diagram illustrating a switched-mode power supply using a reconfigurable delta-sigma modulator (DSM) according to an example embodiment of the present invention.

Referring to FIG. 1, a switched-mode power supply 100 using a reconfigurable delta-sigma modulator (DSM) according to the example embodiment of the present invention includes a current sensing unit 110, a dual mode compensator 120, and a reconfigurable delta-sigma modulator 130 (hereinafter, referred to as "a reconfigurable DSM"), a power switch unit 140, and an attenuator 150. The switched-mode power supply 100 using the reconfigurable DSM 130 may be employed as a DC-DC converter, and performs a stable voltage conversion operation through a feedback operation. Here, $G_C(S)$ is a transfer function of the dual mode compensator 120, $G_m(S)$ is a transfer function of the reconfigurable DSM 130, $G_{VD}(S)$ is a transfer function of the power switch unit 140, and k is a transfer function of the attenuator 150.

The current sensing unit 110 senses a current of an output terminal and determines an operation mode of the dual mode compensator 120, that is, an operation mode of the DC-DC converter, on the basis of the result of current sensing. Here, the current sensing unit 110 determines the operation mode by classifying a current into three types of currents according to a magnitude of the sensed current.

In detail, the current sensing unit 110 classifies the sensed current into a first load current (light load current or low load current) when the sensed current is smaller than a reference value. The current sensing unit 110 classifies the sensed current into a second load current (medium load current or intermediate load current) when the sensed current corresponds to the reference value. The current sensing unit 110 classifies the sensed current into a third load current (heavy load current or high load current) when the sensed current is larger than the reference value. The current sensing unit 110 determines a discontinuous conduction mode (DCM) compensation such that the DCM compensation is performed on the first load current, determines the DCM compensation or a continuous conduction mode (CCM) compensation for the second load current, and determines the CCM compensation for the third load current. Here, the reference value may be a specific one value or a value within a certain range.

Since a buck converter has different transfer functions varying according to a magnitude of the load current, different loop compensations need to be performed in the CCM compensation and the DCM compensation. A DC-DC converter that operates with a CCM compensation using one compensation circuit may be designed, or a DC-DC converter that operates with a DCM compensation using one compensation circuit may be designed. The DCM compensation needs to be used for a light load (low load) condition, and the CCM compensation needs to be used for a heavy load (high load) condition. Thus, according to the present invention, the CCM or DCM compensation is selectively employed according to the magnitude of the sensed current.

The dual mode compensator 120 is provided with a feedback signal $V_{FB}$ that is obtained by multiplying a signal of an output voltage $V_{OUT}$ by a constant gain k and a signal of a reference voltage $V_{REF}$ that determines an output level in order to identify the magnitude of an output signal relative to the reference voltage $V_{REF}$, that is, the magnitude of the signal of the output voltage $V_{OUT}$.

The dual mode compensator 120 performs a CCM compensation or DCM compensation according to the compensation mode determined by the current sensing unit 110. The dual mode compensator 120 performs the DCM compensation for a light load (low load) current, the CCM or DCM compensation for a medium load (intermediate load) current, and the CCM compensation for a heavy load (high load) current. The dual mode compensator 120 amplifies a difference between the input output voltage $V_{OUT}$ and the reference voltage $V_{REF}$ to generate a compensation signal $V_{com}$, and outputs the compensation signal $V_{com}$ for ensuring a loop stability to the reconfigurable DSM 130.

The reconfigurable DSM 130 converts the input compensation signal $V_{com}$ into a digital signal $V_M$ for driving a power switch and supplies the digital signal $V_M$ to the power switch unit 140. The digital signal $V_M$ output from the reconfigurable DSM 130 is generated on the basis of a difference value between the feedback signal $V_{FB}$ and the signal of the reference voltage $V_{REF}$ and serves to adjust on/off time of the power switch arranged on the power switch unit 140. As such, a stable output voltage $V_{OUT}$ may be obtained by the digital signal $V_M$ output from the reconfigurable DSM 130.

The reconfigurable DSM 130 may variably adjust the order of the DSM and the sampling frequency by sensing a current flowing through an inductor or load disposed at the output terminal. As such, an operation mode of the DC-DC converter (CCM or DCM) is selected according to the magnitude of the load current, so that optimized output voltage ripple characteristics are obtained and the efficiency of the power supply is improved.

Figure 2:
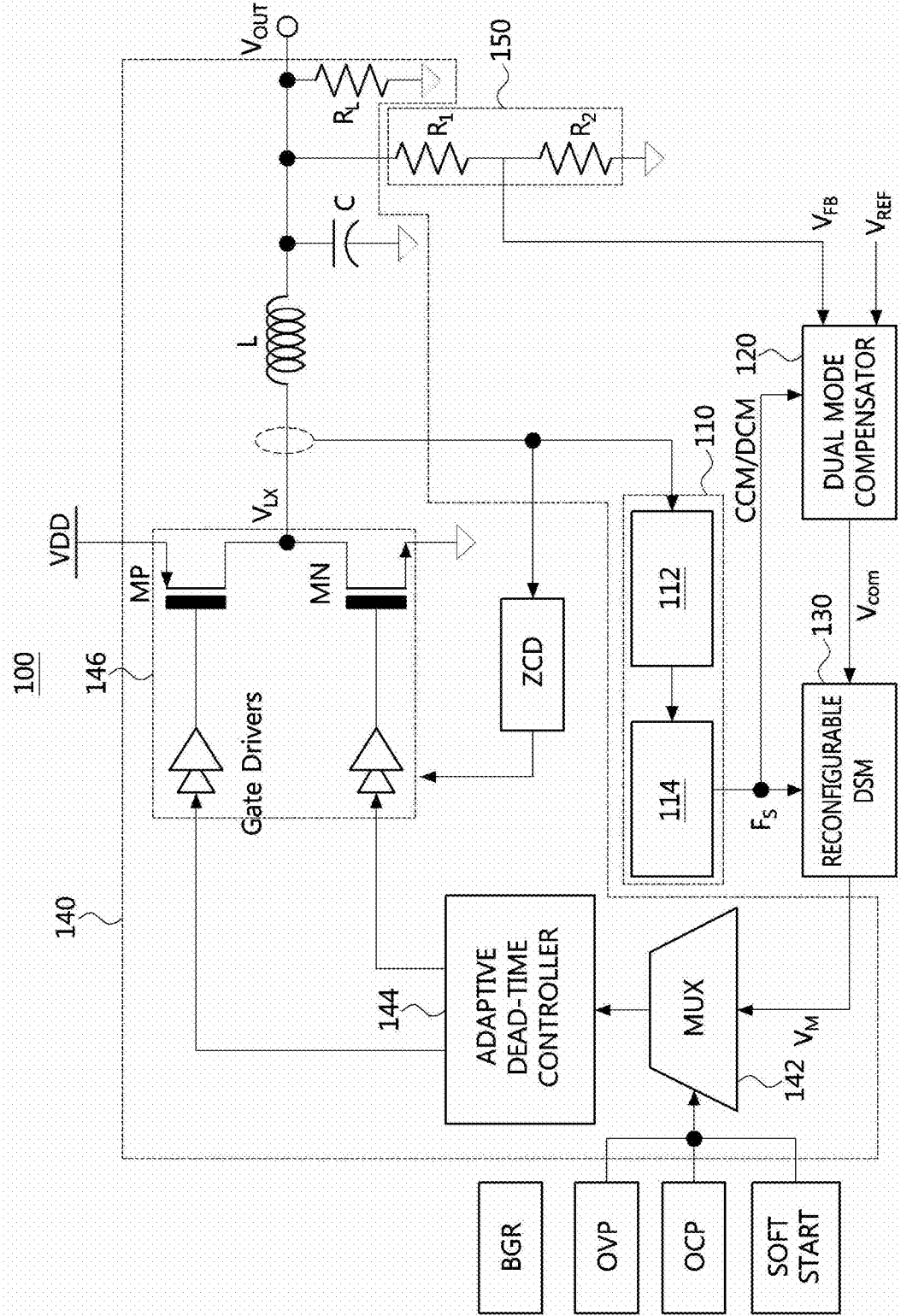
FIG. 2 is a switched-mode power supply using a reconfigurable DSM according to an example embodiment of the present invention, which is implemented as a buck converter.

FIG. 2 is a switched-mode power supply using a reconfigurable DSM according to an example embodiment of the present invention, which is implemented as a buck converter.

Referring to FIG. 2, an example in which the switched-mode power supply shown in FIG. 1 implemented as a buck converter is illustrated.

The current sensing unit 110 includes a current sensing circuit 112 and a mode selector 114. The mode selector 114 determines the operation mode of the DC-DC converter on the basis of current of the output terminal that is sensed by the current sensing circuit 112. The mode selector 114 selects the DCM compensation when the sensed current is a first load current smaller than the reference value and selects the CCM compensation when the sensed current is a third load current larger than the reference value.

The mode selector 114 selects the CCM or DCM compensation when the sensed current is a second load current corresponding to the reference value. At this time, the mode selector 114 may select the CCM compensation when it is desired to improve the ripple characteristic of the output voltage using a high switching frequency, and select the DCM compensation when it is desired to improve the stability of the converter operation using a low switching frequency. In addition, the mode selector 114 may select the DCM compensation when using a second-order loop filter DSM and may select the CCM compensation when using a third-order loop filter DSM.

The power switch unit 140 includes a multiplexer (MUX) 142, an adaptive dead-time controller 144, a gate driver 146, and a plurality of switches MP and MN. Here, a power transistor may be used as the plurality of switches MP and MN.

The output voltage $V_{OUT}$ output from the power switch unit 140 is sensed by the attenuator 150 composed of resistor dividers R1 and R2. The attenuator 150 supplies a feedback voltage $V_{FB}$ obtained by attenuating the output voltage $V_{OUT}$ output from the power switch unit 140 using the resistor divider to the dual mode compensator 120.

The dual mode compensator 120 amplifies the difference value between the output voltage $V_{OUT}$ and the reference voltage $V_{REF}$ to output the compensation signal $V_{com}$.

The reconfigurable DSM 130 generates a digital signal $V_M$ through noise-shaping and transmits the generated digital signal $V_M$ to the adaptive dead-time controller 144 via the multiplexer 142. At this time, the reconfigurable DSM 130 generates the digital signal $V_M$ by performing noise-shaping on the compensation signal $V_{com}$ using a 1-bit delta-sigma modulation. Since the digital signal $V_M$ generated by the DSM 130 has a random instantaneous frequency component, the influence of switching harmonic can be reduced.

The power switch unit 140 includes a zero crossing detector (ZCD) that detects a zero crossing of the output signal of the output terminal, and the ZCD supplies a signal resulting from zero crossing detection of the output signal to the gate driver 146. The gate driver 146 operates according to a control signal output from the adaptive dead-time controller 144 to generates a scan signal, and outputs the generated scan signal to selectively turn on/off the plurality of switches MP and MN.

The switched-mode power supply 100 using a reconfigurable DSM according to the example embodiment of the present invention may selectively apply an operation mode of the dual mode compensator 120 and the reconfigurable DSM 130 according to the magnitude of the output current (or load current) as shown in Table 1.

TABLE 1

| | Current sensing | | |
|---|---|---|---|
| | Light load current (Low load current) | Medium load current (Intermediate load current) | Heavy load current (High load current) |
| Order of DSM | Second order | Second order | Third order | Third order |
| Sampling frequency | Low frequency | Intermediate frequency | | High frequency |
| Compensation mode | DCM compensation | DCM compensation | CCM compensation | CCM compensation |

According to the present invention, a switching frequency of the reconfigurable DSM 130 may be set to three switching frequencies. For example, one of a first switching frequency (low frequency), a second switching frequency (intermediate frequency) higher than the first switching frequency, and a third switching frequency (high frequency) higher than the second switching frequency may be selected and set as the switching frequency of the reconfigurable DSM 130.

Hereinafter, a method of driving the reconfigurable DSM 130 and the dual mode compensator 120 in response to determination of a light load current will be described.

In the state of the light load current (e.g., less than 20 [mA]) having a switching loss larger than a conduction loss, in order to improve the efficiency of the DC-DC converter, a low switching frequency (a first switching frequency, for example, 3.75 [MHz]) is employed as the switching frequency of the reconfigurable DSM 130.

According to the conventional DSM, a change in the switching frequency may degrade driving stability, generating oscillation, and thus an RC value of an integrator is changed so as to maintain the stability. On the other hand, the reconfigurable DSM according to the example embodiment of the present invention may maintain the driving stability by lowering the order of the loop filter of the reconfigurable DSM 130 from the third order to the second order to prevent degradation of the driving stability that may occur due to using a low switching frequency (first switching frequency). That is, the switched-mode power supply 100 using the reconfigurable DSM according to the example embodiment of the present invention may, in response to detecting a light load current, set the switching frequency of the reconfigurable DSM 130 to a low switching frequency (first switching frequency), and set the order of the loop filter of the reconfigurable DSM 130 to the second order. As such, when the order of the loop filter of the reconfigurable DSM is set to the second order, a loop gain is lowered, and thus the driving stability can be ensured without changing the RC value. Here, when a section in which a current flowing through an inductor L is less than or equal to 0 exists, the light load current is determined, and the dual mode compensator 120 performs the DCM compensation.

Hereinafter, a method of driving the reconfigurable DSM 130 and the dual mode compensator 120 in response to determination of a medium load current will be described.

In the state of the medium load current (for example, 20 to less than 200 [mA]), the conduction loss and the switching loss are similar, and thus the efficiency of the DC-DC converter may be degraded when the sampling frequency is significantly low or high. Accordingly, for the area, an intermediate sampling frequency (second sampling frequency, e.g., 7.50 [MHz]) may be used as the switching frequency of the reconfigurable DSM 130 to increase the efficiency of the DC-DC converter. That is, in the medium load current state, a sampling frequency (first sampling frequency< second sampling frequency) higher than a sampling frequency used in the light load current state is used.

When setting the order of the loop filter of the reconfigurable DSM 130, as for the medium load current state, the order of the loop filter of the reconfigurable DSM 130 may be set to the second order or the third order according to the characteristics of the DC-DC converter desired. For example, in order to obtain a high driving stability, the order of the loop filter of the reconfigurable DSM 130 may be set to the second order. On the other hand, in order to obtain a characteristic of highly eliminating a harmonic frequency component of the output voltage, the order of the loop filter of the reconfigurable DSM 130 may be set to the third order. In addition, the mode of the dual mode compensator 120 may be set to a DCM compensation mode or a CCM compensation mode according to the magnitude of the current.

Hereinafter, a method of driving the reconfigurable DSM 130 and the dual mode compensator 120 in response to determination of a heavy load current will be described.

In the state of the heavy load current determined as a result of the current sensing by the current sensing unit 110, (for example, 200 mA or more), that is, a current area in which the conduction loss is larger than the switching loss, a high switching frequency (a third switching frequency, for example, 15.0 MHz) is employed as the switching frequency of the reconfigurable DSM 130 in order to improve the efficiency of the DC-DC converter.

A third-order loop filter may be used for the reconfigurable DSM 130 to increase the efficiency of eliminating the harmonic frequency component of the output voltage. That is, in a state of the heavy load current determined as a result of current sensing by the current sensing unit 110, a sampling frequency (the second sampling frequency< the third sampling frequency) higher than that used in the medium load current state is used. The harmonic frequency component of the output voltage resulting from using the high sampling frequency may be eliminated by using the third-order DSM. That is, the use of a high sampling frequency in the heavy load current state may improve the ripple characteristics of the output voltage. That is, low ripple characteristics in the output voltage may be obtained. In addition, considering the large magnitude of current, the mode of the dual mode compensator 120 is set to the CCM compensation mode.

Figure 3:
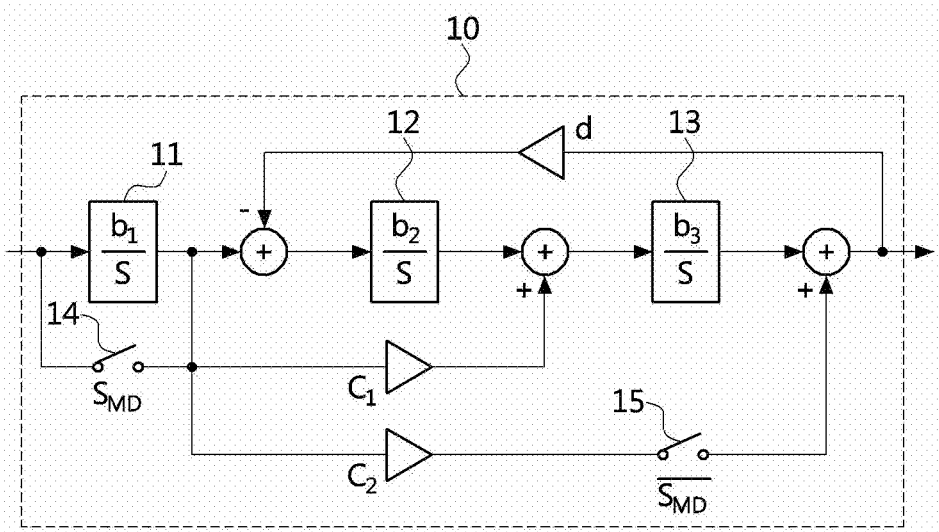
FIG. 3 is a view illustrating a third-order loop filter according to an example embodiment of the present invention.
Figure 4:
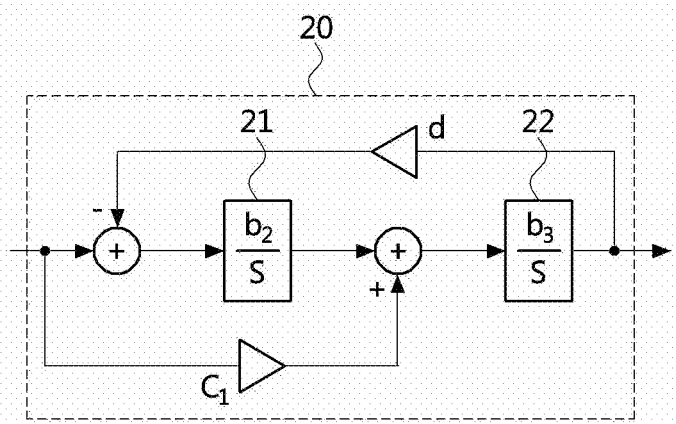
FIG. 4 is a view illustrating a second-order loop filter according to an example embodiment of the present invention.

FIG. 3 is a view illustrating a third-order loop filter according to an example embodiment of the present invention, and FIG. 4 is a view illustrating a second-order loop filter according to an example embodiment of the present invention.

Referring to FIG. 3, an example in which the loop filter of the reconfigurable DSM 130 is configured to have a third order is illustrated. When a loop filter 10 of the reconfigurable DSM 130 is configured in a third order, a first switch 14 is turned off and a second switch 15 is turned on to constitute a third-order transfer function.

The third-order loop filter 10 of the reconfigurable DSM 130 may be implemented by including a first integrator 11, a second integrator 12, and a third integrator 13. Here, the first integrator 11, the second integrator 12, and the third integrator 13 are connected in series. An output of the first integrator 11 may be fed forward to have a coefficient $C_1$ and summed with an output of the second integrator 12.

In addition, the output of the first integrator 11 may be fed forward to have a coefficient $C_2$ and summed with an output of the third integrator 13.

Here, an output of the loop filter 10 configured to have a third order may be fed back to have a coefficient d, and subtracted from the output of the first integrator 11.

A transfer function TF3 of the third-order loop filter 10 as shown in FIG. 3 is derived by Equation. 1

$$TF_3 = \frac{b_1 c_2 s^2 + b_1 b_3 c_1 s + b_1 b_2 b_3}{s \cdot (s^2 + b_2 b_3 d)} \quad \text{[Equation 1]}$$

In Equation 1, $TF_3$ is a transfer function represented by s(jw) domain through the output/input of the third-order loop filter 10. $b_1$, $b_2$, $b_3$, $c_1$, $c_2$, and d represent the coefficients of respective feedforward and feedback paths.

Referring to the above Equation 1, the transfer function $TF_3$ having three poles and two zeros may be derived.

Here, two switches 14 and 15 may be added as shown in the block of FIG. 3. By removing one of the integrators through turning on/off of the two switches 14 and 15, the third-order loop filter may be converted into a second-order loop filter having two poles as shown in FIG. 4.

In detail, the first switch 14 may be disposed parallel to the first integrator 11 such that the first integrator 11 is selectively used (added or removed). In addition, the second switch 15 may be disposed on a loop for feeding forward the output of the first integrator 11 to the output of the third integrator 13.

Referring to FIG. 3 in conjunction with FIG. 4, the first switch 14 is turned on to remove the first integrator 11, and the second switch 15 is turned off to remove the feedforward loop. Accordingly, a second-order loop filter 20 including a first integrator 21 and a second integrator 22 may be formed as shown in FIG. 4.

As such, the second-order loop filter 20 of the reconfigurable DSM 130 is configured to have two integrators 21 and 22 and one feedforward loop and one feedback loop as a result of removing one integrator 11 from the third-order loop filter 10.

A transfer function $TF_2$ of the second-order loop filter 20 shown in FIG. 4 is obtained by Equation 2 below. Referring to Equation 2, the transfer function $TF_2$ having two poles and one zero may be derived.

$$TF_2 = \frac{b_3 c_1 s + b_2 b_3}{s^2 + b_2 b_3 d} \quad \text{[Equation 2]}$$

In Equation 2, $TF_2$ is a transfer function represented by s(jw) domain through the output/input of the second-order loop filter 20. $b_2$, $b_3$, $c_1$, and d denote the coefficients of the respective feedforward and feedback paths.

The transfer function $TF_3$ of the third-order loop filter 10 and the transfer function $TF_2$ of the second-order loop filter 20 may be each implemented as a switching circuit.

The third-order loop filter 10 from which one integrator is removed may be converted into the second-order loop filter 20, and the second-order loop filter 20 to which one integrator is added may be converted into the third-order loop filter 10. The conventional DC-DC converter is required to adjust coefficients for compensating for integrator circuits which are turned on/off. However, the use of the loop filters 10 and 20 according to the present invention allows the order conversion between a second order and a third order to be simply performed through switching.

Hereinafter, a method of converting a mode (an order) between the second-order loop filter and the third-order loop filter will be described in detail.

Figure 5:
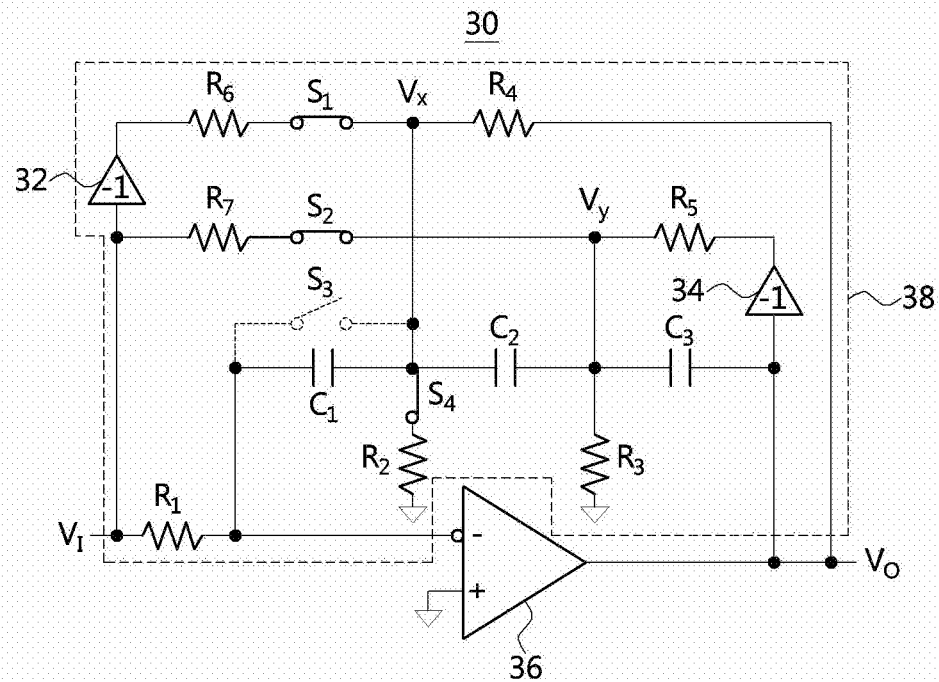
FIG. 5 is a first circuit diagram illustrating a loop filter according to an example embodiment of the present invention.

FIG. 5 is a first circuit diagram illustrating a loop filter according to an example embodiment of the present invention.

Referring to FIG. 5, a circuit diagram in which a third-order loop filter is implemented using one operational amplifier is shown. The conventional DC-DC converter constitutes a third-order loop filter using three operational amplifiers. The use of three operational amplifiers increases the physical area for constituting the circuit and the power consumption for driving. In contrast, the switched-mode power supply using the reconfigurable DSM according to the example embodiment of the present invention may reduce the area of the circuit and the power consumption by constituting a third-order loop filter 30 using one operational amplifier 36.

The loop filter 30 shown in FIG. 5 includes one operational amplifier 36 and an RC network 38, which is connected to the operational amplifier 36 and satisfies the three-order transfer function, the RC network 38 including a plurality of capacitors $C_1$, $C_2$, and $C_3$, a plurality of resistors $R_1$ to $R_7$, and a first inverting circuit 32 and a second inverting circuit 34. The RC network 38 includes three capacitors $C_1$, $C_2$, and $C_3$ connected in series and seven resistors $R_1$ to $R_7$ connected in series or parallel to a virtual ground $V_G$, which is an internal node, a first node $V_X$, and a second node $V_Y$. At least one of the three capacitors $C_1$, $C_2$, and $C_3$ may be a variable capacitor, and at least one of the seven resistors $R_1$ to $R_7$ may be a variable resistor. According to an example embodiment, the three capacitors $C_1$, $C_2$, and $C_3$ may all be variable capacitors, and the seven resistors $R_1$ to $R_7$ may all be variable resistors.

The operational amplifier 36 includes a first input terminal (−) and a second input terminal (+), and may operate as a differential amplifier in response to a differential signal input to the first input terminal (−) and the second input terminal (+).

Here, the loop filter 30 may allow the signal transfer characteristic to satisfy the third-order transfer function through on/off control of at least one of switches $S_1$ to $S_3$. In addition, the loop filter 30 may allow the signal transfer characteristic to satisfy the second-order transfer function through on/off control of at least one of the switches $S_1$ to $S_3$. That is, the present invention may constitute a loop filter satisfying the third-order transfer function or a loop filter satisfying the second-order transfer function using one RC network 38.

In detail, referring to the third-order loop filter 30, the first capacitor $C_1$, the second capacitor $C_2$, and the third capacitor $C_3$ are connected in series to each other. The first capacitor $C_1$, the second capacitor $C_2$, and the third capacitor $C_3$ connected in series to each other are connected in parallel to the operational amplifier 36 between the first input terminal (−) of the operational amplifier 36 and an output terminal $V_O$ of the operational amplifier 36. The first resistor $R_1$, the second resistor $R_2$, the third resistor $R_3$, the fourth resistor $R_4$, the fifth resistor $R_5$, the sixth resistor $R_6$, and the seventh resistor $R_7$ are connected in series or parallel to the virtual ground $V_G$, which is an internal node, the first node $V_X$, and the second node $V_Y$. Here, the virtual ground $V_G$ is a node located on an input line of the operational amplifier 36, the first node $V_X$ is located between the first capacitor $C_1$ and the second capacitor $C_2$, and the second node $V_Y$ is located between the second capacitor $C_2$ and the third capacitor $C_3$.

In addition, the first inverting circuit 32 inverts an input signal from a third node $V_I$ and outputs the inverted signal. The second inverting circuit 34 inverts a signal output from the output terminal $V_O$ of the operational amplifier 36 and outputs the inverted signal. Here, the first inverting circuit 32 and the second inverting circuit 34 may provide a negative signal in the loop filter.

The first resistor $R_1$ is located on the input line of the operational amplifier 36 and is connected to the $V_G$ node. The second resistor $R2$ is connected between the first node $V_X$ and a ground. The third resistor $R_3$ is connected between the second node $V_Y$ and the ground. The fifth resistor $R_5$ and the seventh resistor $R_7$ are connected to the second node $V_Y$. The fourth resistor $R_4$ and the sixth resistor $R_6$ are connected to the first node $V_X$. The fifth resistor $R_5$ is connected between an output line of the operational amplifier 36 and the second node $V_Y$, and the fourth resistor $R_4$ is connected between the output line of the operational amplifier 36 and the first node $V_X$. The sixth resistor $R_6$ is connected between the input line of the operational amplifier 36 and the first node $V_X$. The seventh resistor $R_7$ is connected between the input line of the operational amplifier 36 and the second node $V_Y$.

The third node $V_I$ to which the input signal of the loop filter is applied is connected to a first terminal of the first resistor $R_1$, and the first input terminal (−) of the operational amplifier 36 is connected to a second terminal of the first resistor $R_1$. The first resistor $R_1$ is disposed between the third node ($V_I$, an input terminal) and the first capacitor $C_1$.

A first terminal of the first capacitor $C_1$ is connected to the second terminal of the first resistor $R_1$, and a second terminal of the first capacitor $C_1$ is connected to a first terminal of the second capacitor $C_2$. A second terminal of the second capacitor $C_2$ is connected to a first terminal of the third capacitor $C_3$, and a second terminal of the third capacitor $C_3$ is connected to the output terminal $V_O$ of the operational amplifier 36.

The first node $V_X$ is formed between the second terminal of the first capacitor $C_1$ and the first terminal of the second capacitor $C_2$. A first terminal of the second resistor $R_2$ is connected to the first node $V_X$, and a second terminal of the second resistor $R_2$ is connected to the ground.

The second node $V_Y$ is formed between the second terminal of the second capacitor $C_2$ and the first terminal of the third capacitor $C_3$. A first terminal of the third resistor $R_3$ is connected to the second node $V_Y$, and a second terminal of the third resistor $R_3$ is connected to the ground.

A first terminal of the fourth resistor $R_4$ is connected to the first node $V_X$, and a second terminal of the fourth resistor $R_4$ is connected to the output terminal $V_O$ of the operational amplifier 36.

The fifth resistor $R_5$ is connected parallel to the third capacitor $C_3$, and a first terminal of the fifth resistor $R_5$ is connected to the second node $V_Y$, and a second terminal of the fifth resistor $R_5$ is connected to the output terminal $V_O$ of the operational amplifier 36.

A first terminal of the sixth resistor $R_6$ is connected to an output terminal of the first inverting circuit 32, and a second terminal of the sixth resistor $R_6$ is connected to the first node $V_X$. At this time, a first switch $S_1$ is disposed between the second terminal of the sixth resistor $R_6$ and the first node $V_X$. The sixth resistor $R_6$ comes into connection to the first node $V_X$ when the first switch $S_1$ is turned on.

A first terminal of the seventh resistor $R_7$ is connected to the third node $V_I$ (the input terminal of the first inverting circuit 32), and a second terminal of the seventh resistor $R_7$ is connected to the second node $V_Y$. At this time, a second switch $S_2$ is disposed between the second terminal of the seventh resistor $R_7$ and the second node $V_Y$. When the second switch $S_2$ is turned on, the seventh resistor $R_7$ is connected to the second node $V_Y$.

A third switch $S_3$ is connected parallel to the first capacitor $C_1$.

The loop filter 30 may further include a fourth switch $S_4$ disposed between the first terminal of the second resistor $R_2$ and the first node $V_X$. The loop filter 30 turns on the first switch $S_1$, the second switch $S_2$, and the fourth switch $S_4$ and turns off the third switch $S_3$, thereby satisfying the third-order transfer function.

As described above, the third-order loop filter 30 is implemented using one operational amplifier 36, and implements the third-order transfer function through the three capacitors and the seven resistors connected in series or parallel to the internal node $V_G$, the first node $V_X$, and the second node $V_Y$.

As shown in FIG. 5, an input positive voltage signal $V_i$ is applied to the second node $V_Y$ through the seventh resistor $R_7$ according to the connection of the resistors and capacitors of the RC network 38. An output positive voltage signal $V_O$ is applied to the first node $V_X$ through the fourth resistor $R_4$. In addition, an input negative voltage signal $-V_i$ is applied to the first node $V_X$ through the sixth resistor $R_6$. An output negative voltage signal $-V_O$ is applied to the second node $V_Y$ through the fifth resistor $R_5$.

As such, the transfer function is provided with a negative signal, so that coefficients are easily adjusted. In addition, the value of the capacitor may be varied such that the circuit operates stably even in a state of PVT variation. In addition, the value of the resistor as well as the capacitor may be varied such that a value according to external environment change may be compensated for. The operational amplifier 36 may be used by adjusting a voltage gain and a bandwidth according to the frequency at which the loop filter 30 operates.

Figure 6:
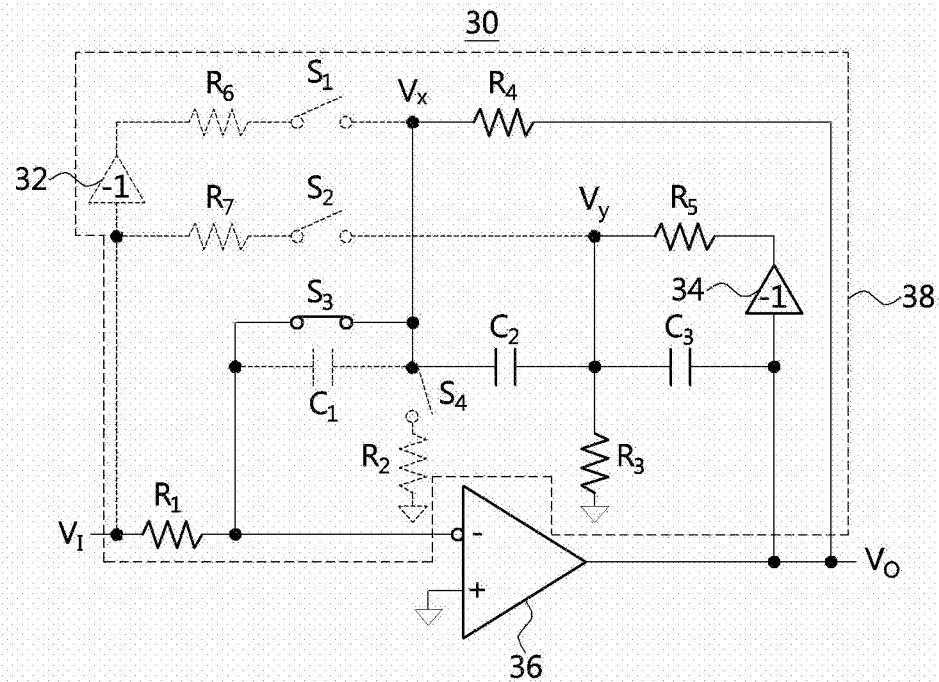
FIG. 6 is a second circuit diagram illustrating a loop filter according to an example embodiment of the present invention.

FIG. 6 is a second circuit diagram illustrating a loop filter according to an example embodiment of the present invention. In the description of FIG. 6, the configuration and connection structure identical to those described with reference to FIG. 5 will be omitted.

Referring to FIG. 6, a circuit diagram in which a second-order loop filter is implemented using one operational amplifier is shown. The loop filter 30 may satisfy the second-order transfer function by turning off the first switch $S_1$, the second switch $S_2$, and the fourth switch $S_4$ and turning on the third switch $S_3$. The switched-mode power supply using the reconfigurable DSM according to the example embodiment of the present invention may reduce the area and power consumption of the circuit by constituting the second-order loop filter 30 using one operational amplifier 36.

In detail, referring to the second-order loop filter 30, the sixth resistor $R_6$ and the first inverting circuit 32 may be removed from the circuit by turning off the first switch $S_1$.

In addition, the seventh resistor $R_7$ may be removed from the circuit by turning off the second switch $S_2$.

In addition, the influence of the first capacitor $C_1$ may be removed from the circuit by turning on the third switch $S_3$.

In addition, the second resistor $R_2$ may be removed from the circuit by turning off the fourth switch $S_4$.

To summarize FIGS. 5 and 6, by disposing the plurality of switches $S_1$ to $S_4$ in the third-order loop filter circuit implemented by one operational amplifier 36, some passive elements may be removed from the circuit, and accordingly the order may be changed and thus the third-order loop filter circuit may operate as a second-order loop filter. That is, the loop filter 30 may change the order from a third order to a second order, and conversely, from the second order to the third order.

It is assumed that the capacitors $C_1$ to $C_3$ satisfy a relation of $C_1=2=C_2=C_3=C$ for the sake of analysis of the third-order loop filter shown in FIG. 5. Also, it is assumed that the second resistor $R_2$, the fourth resistor $R_4$, and the sixth resistor $R_6$ satisfy a relation of $R_X=R_2\|R_4\|R_6$. Also, it is assumed that the third resistor $R_3$, the fifth resistor $R_5$, and the seventh resistor $R_7$ satisfy a relation of $R_Y=R_3\|R_5\|R_7$.

Based on the above defined relations, the transfer function ($TF_3$, proposed) of the third-order loop filter shown in FIG. 5 may be derived as in Equation 3.

$$TF_{3,proposed} = -\frac{s^2 \cdot \frac{1}{C}\left(\frac{4}{R_1} + \frac{1}{R_7} - \frac{3}{R_6}\right) + s \cdot \frac{1}{C_2}\left[\frac{3}{R_1}\left(\frac{1}{R_X} + \frac{1}{R_Y}\right) - \frac{2}{R_6 R_Y}\right] + \frac{2}{C^3 R_1}\left(\frac{1}{R_X R_Y}\right)}{s \cdot \left(s^2 + \frac{2}{C^2 R_4 R_Y}\right)}$$ [Equation 3]

In addition, a resonating condition of the third-order loop filter shown in FIG. 5 may be derived as in Equation 4.

$$R_4 = 3 \cdot R_5$$ [Equation 4]

Meanwhile, the transfer function ($TF_2$, proposed) of the second-order loop filter shown in FIG. 6 may be derived as in Equation 5, on the basis of the above-defined relations between the capacitors and the resistors.

$$TF_{2,proposed} = -\frac{s \cdot \frac{3}{CR_1} + \frac{2}{C^2 R_1}\left(\frac{1}{R_3} + \frac{1}{R_5}\right)}{s^2 + \frac{2}{C^2 R_4}\left(\frac{1}{R_3} + \frac{1}{R_5}\right)}$$ [Equation 5]

Figure 7:
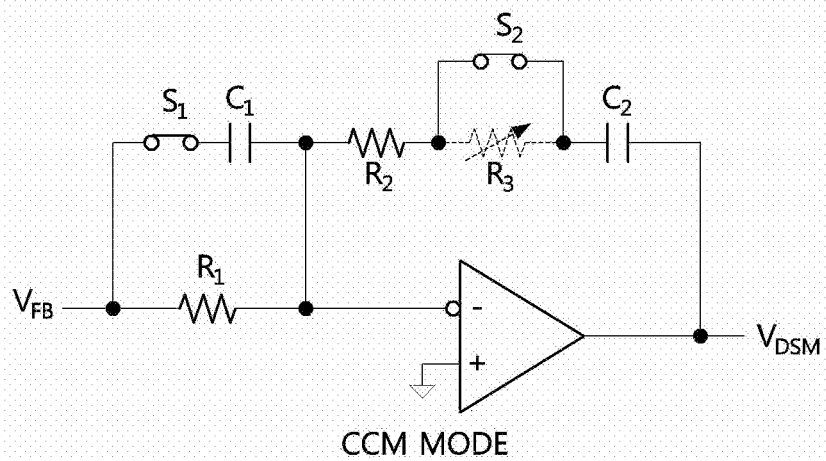
FIG. 7 is a circuit diagram of a CCM compensator.

In addition, a resonating condition of the second-order loop filter shown in FIG. 7 may be derived as in Equation 6.

$$R_4 = 3 \cdot R_5$$ [Equation 6]

In comparison of Equation 4 and Equation 6, the fourth resistor $R_4$ and the fifth resistor $R_5$ are variable resistors, and the resonating condition may be adjusted by varying the fourth resistor $R_4$ and the fifth resistor $R_5$.

In addition, it can be seen that the resonating condition may be maintained even when at least one switch is adjusted to satisfy the third-order transfer function or the second-order transfer function.

Since the resonating condition serves to adjust the zero position in a noise transfer function (NTF), the capability of maintaining the resonating condition represents that the DSM may have a maximum signal-to-noise ratio (SNR) for a particular signal bandwidth.

In detail, when the resonating condition is changed in the converting of the loop filter order, the values of other passive elements need to be readjusted to obtain the maximum SNR, which causes the entire circuit area and power consumption to be increased. However, when the resonating condition is maintained, the maximum SNR may be obtained without re-adjusting the passive element values.

In addition, the signal bandwidths of the second-order loop filter and the third-order loop filter described above may be adjusted through resonance frequencies.

The resonance frequencies of the second-order loop filter and the third-order loop filter may be derived from the condition that the denominator of each transfer function of the second-order loop filter and the third-order loop filter becomes zero, and a resonance frequency ratio S of the second-order loop filter and the third-order loop filter may be derived as in Equation 7.

$$S = \sqrt{\frac{\frac{1}{R_3} + \frac{1}{R_5}}{\frac{1}{R_3} + \frac{1}{R_5} + \frac{1}{R_7}}}$$ [Equation 7]

Referring to Equation 7, the numerator and denominator inside the root of the resonance frequency ratio S correspond to conductance of the third resistor $R_3$ and the fifth resistor $R_5$ in FIG. 6 and conductance of the third resistor $R_3$, the fifth resistor $R_5$, and the seventh resistor $R_7$ in FIG. 5, respectively.

When compared to the third-order loop filter shown in FIG. 5, the second-order loop filter shown in FIG. 6 has a different bandwidth due to the seventh resistor $R_7$, and thus may have a reduced bandwidth equivalent to omission of the seventh resistor $R_7$. Accordingly, by designing the seventh resistor $R_7$ as a variable resistor in the relation to the bandwidth of the third-order loop filter and changing the value of the seventh resistor $R_7$, the change in the bandwidth according to conversion of the order may be adjusted.

Meanwhile, in the converting of the third-order loop filter to the second-order loop filter by switching, the stability issue may arise because the stability condition is changed according to the change in the order. In general, in order to maintain the stability of the DSM, feedback coefficients of a digital-to-analog converter (DAC) are changed or the values of passive elements are changed.

However, the switched-mode power supply using the reconfigurable DSM according to the example embodiment of the present invention may maintain the stability even with the change in the order of loop filter by adjusting the loop gain.

In detail, considering that the second-order loop filter is more stable than the third-order loop filter, when the stability of the third-order loop filter is satisfied first and then the loop gain of the converted second-order loop filter is adjusted, the stability of the DSM can be maintained before and after the conversion of the order.

In detail, a loop gain ratio (LGR) of the third-order loop filter of FIG. 5 and the second-order loop filter of FIG. 6 according to the present invention may be derived as in Equation 8.

$$LGR = \frac{\frac{3}{R_1}}{\frac{4}{R_1} + \frac{1}{R_7} - \frac{3}{R_6}} \quad \text{[Equation 8]}$$

Here, the numerator of the LGR is the first order term of the numerator of the transfer function of the second-order loop filter shown in Equation 5, and the denominator of the LGR is the second order term of the numerator of the transfer function of the third-order loop filter shown in Equation 3.

Accordingly, the loop filter according to the example embodiment of the present invention sets at least one of the first resistor $R_1$, the sixth resistor $R_6$, and the seventh resistor $R_7$ as a variable resistor. Then, at least one of the first resistor $R_1$, the sixth resistor $R_6$, and the seventh resistor $R_7$ is adjusted such that the loop gain is changed. Accordingly, high stability is maintained even when the order is converted.

Referring again to FIG. 2, in order to stably operate the DC-DC converter, the dual mode compensator 120 is arranged for frequency compensation of the converter loop. When the switched-mode power supply 100 using a reconfigurable DSM according to the example embodiment of the present invention is implemented as a buck converter, the frequency compensation is performed in different modes according to the magnitude of the output current.

Figure 8:
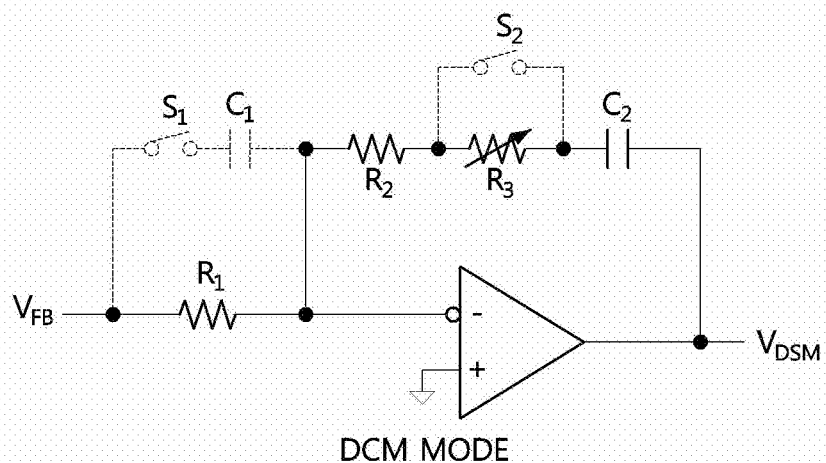
FIG. 8 is a circuit diagram of a DCM compensator.

FIG. 7 is a circuit diagram of a CCM compensator, and FIG. 8 is a circuit diagram of a DCM compensator.

Referring to FIG. 7 in conjunction with FIGS. 2 and 8, an output feedback signal $V_{FB}$ obtained by multiplying a voltage gain is applied to the first input terminal (−) of the operational amplifier (differential amplifier). A value of the reference voltage $V_{REF}$ is applied to the second input terminal (+) of the operational amplifier. The output of the operational amplifier is applied to the input of the reconfigurable DSM 130. At this time, a digital modulation value is output from the operational amplifier of the dual mode compensator 120.

In the CCM operation of the buck converter shown in FIG. 7, the loop is compensated for through one pole and two zeroes. Meanwhile, in the DCM operation of the buck converter shown in FIG. 8, the loop is compensated for through one pole and one zero.

In the DCM operation, the dual mode compensator 120 according to the present invention may perform compensation in the same manner as a pulse width modulation (PWM) method even with different orders of the loop filter and different sampling frequencies. Since the reconfigurable DSM 130 operates with a high frequency at which the poles and the zeros formed in the third-order loop filter or the second-order loop filter neither affect nor are affected by the power switches, the dual mode compensator 120 may perform compensation in the same manner as the PWM method. Thus, the dual mode compensator 120 applies different compensation modes according to the order of the loop filter of the reconfigurable DSM 130 (see Table 1), and has characteristics independent of the reconfigurable DSM 130.

In the CCM operation according to the present invention, a transfer function ($G_c$, CCM (S)) of the dual mode compensator 120 may be derived as in Equation 9. In the DCM operation, a transfer function ($G_c$, DCM (S)) of the dual mode compensator 120 may be derived as in Equation 10.

$$G_{c,CCM}(s) = \frac{(sC_2R_2+1)(sC_1R_1+1)}{sC_2R_1} \quad \text{[Equation 9]}$$

$$G_{c,DCM}(s) = \frac{sC_2(R_2+R_3)+1}{sC_2R_1}. \quad \text{[Equation 10]}$$

In the related art, a compensator for CCM driving and a compensator for DCM driving need to be provided individually, whereas according to the present invention, the CCM driving and the DCM driving may be switched using a single dual mode compensator 120. That is, in the same way in which the order of the loop filter is changed in the reconfigurable DSM 130, a plurality of switches are arranged in the circuit of the dual mode compensator 120, and the plurality of switches is controlled to be turned on/off such that the CCM driving and DCM driving may be switched.

The CCM and DCM circuits shown in FIGS. 7 and 8 each include one operational amplifier and a plurality of capacitors $C_1$ and $C_2$, a plurality of resistors $R_1$ to $R_3$, and a plurality of switches $S_1$ and $S_2$, connected to the operational amplifier.

The operational amplifier includes a first input terminal (−) and a second input terminal (+), and operates as a differential amplifier in response to a differential signal input to the first input terminal (−) and the second input terminal (+).

A first terminal of the first resistor $R_1$ is connected to a feedback input terminal $V_{FB}$ and a second terminal of the first resistor $R_1$ is connected to the first input terminal (−) of the operational amplifier.

The first capacitor $C_1$ is connected parallel to the first resistor $R_1$, and a first terminal of the first capacitor $C_1$ is connected to the feedback input terminal $V_{FB}$, and a second terminal of the first capacitor $C_1$ is connected to the first input terminal (−) of the operational amplifier.

The first switch $S_1$ is connected parallel to the first resistor $R_1$. The first switch $S_1$ is disposed between the feedback input terminal $V_{FB}$ and the first capacitor $C_1$. When the first switch $S_1$ is turned on, the first capacitor $C_1$ is connected to the feedback input terminal $V_{FB}$. Meanwhile, when the first switch $S_1$ is turned off, the first capacitor $C_1$ is removed from the circuit.

The second resistor $R_2$ is connected in series to the first capacitor $C_1$ and the third resistor $R_3$, and is connected parallel to the operational amplifier. A first terminal of the second resistor $R_2$ is connected to the first terminal of the first capacitor $C_1$ and the feedback input terminal $V_{FB}$. A second terminal of the second resistor $R_2$ is connected to a first terminal of the third resistor $R_3$.

The third resistor $R_3$ is connected in series to the second resistor $R_2$ and the second capacitor $C_2$ and is connected parallel to the operational amplifier. The first terminal of the third resistor $R_3$ is connected to the second terminal of the second resistor $R_2$, and a second terminal of the third resistor $R_3$ is connected to a first terminal of the second capacitor $C_2$. Here, the third resistor $R_3$ may be provided as a variable resistor, and the second switch $S_2$ is connected parallel to the third resistor $R_3$.

The second capacitor $C_2$ is connected in series to the third resistor $R_3$ and is connected parallel to the operational amplifier. The first terminal of the second capacitor $C_2$ is connected to the first terminal of the third resistor $R_3$, and a second terminal of the second capacitor $C_2$ is connected to an output terminal $V_{DSM}$ of the operational amplifier.

The second switch $S_2$ is connected parallel with the third resistor $R_3$. A first terminal of the second switch $S_2$ is connected between the second resistor $R_2$ and the third resistor $R_3$, and a second terminal of the second switch $S_2$ is connected between the third resistor $R_3$ and the second capacitor $C_2$. When the second switch $S_2$ is turned on, the third resistor $R_3$ is removed from the circuit. On the other hand, when the second switch $S_2$ is turned off, the third resistor $R_3$ is connected to the second resistor $R_2$ and the second capacitor $C_2$.

As shown in FIG. 7, when the first switch $S_1$ is turned on, the first capacitor $C_1$ is charged. When the second switch $S_2$ is turned on and the third resistor $R_3$ is removed from the circuit, the dual mode compensator 120 operates in the CCM.

As shown in FIG. 8, when the first switch $S_1$ is turned off, the first capacitor $C_1$ is removed from the circuit. When the second switch $S_2$ is turned off and thus a loop connecting the operational amplifier, the first resistor $R_1$, the second resistor $R_2$, the third resistor $R_3$, and the second capacitor $C_2$ is formed, the dual mode compensator 120 operates in the DCM.

As described above, CCM driving or DCM driving of the dual mode compensator 120 may be selectively converted by controlling the on/off states of the first switch $S_1$ and the second switch $S_2$ disposed in the circuit.

Figure 9:
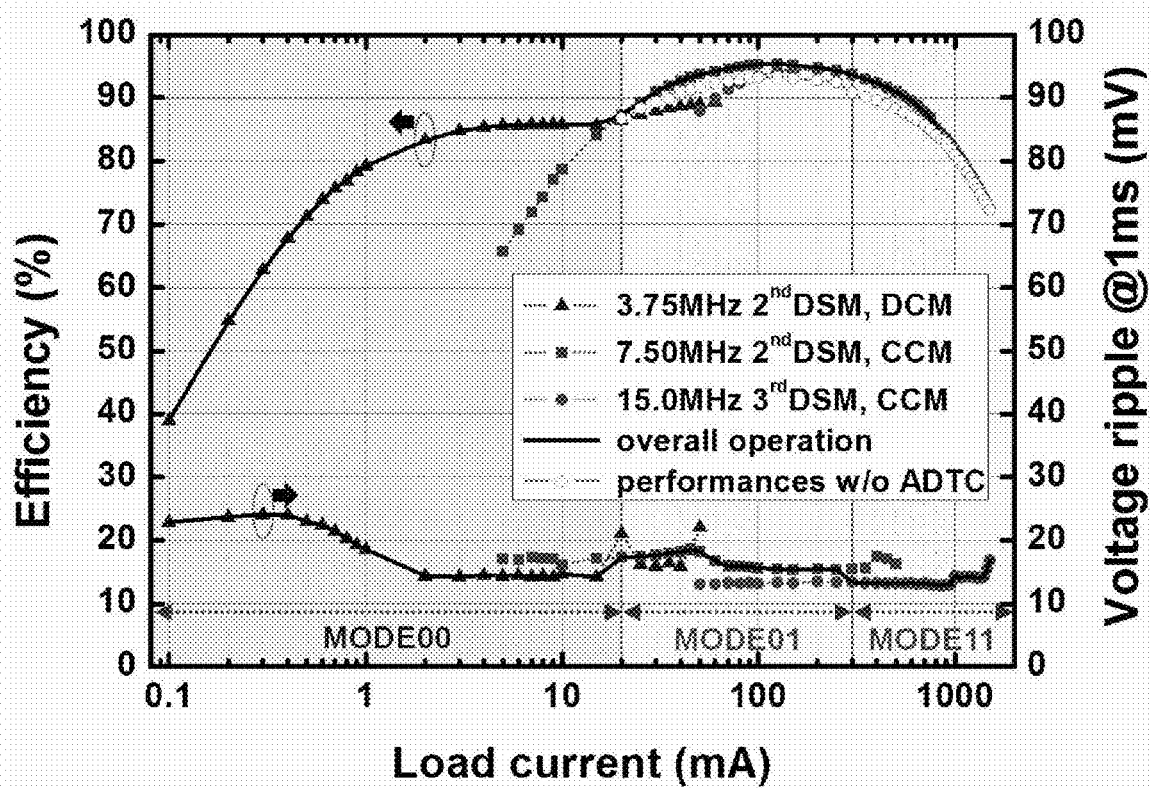
FIG. 9 is a view showing efficiency and voltage ripple characteristics according to a load current of a switched-mode power supply using a reconfigurable DSM (a buck DC-DC converter) according to an example embodiment of the present invention.

FIG. 9 is a view showing efficiency and voltage ripple characteristics according to a load current of a switched-mode power supply using a reconfigurable DSM (a buck DC-DC converter) according to an example embodiment of the present invention.

Referring to FIG. 9, the switched-mode power supply using a reconfigurable DSM according to the example embodiment of the present invention is driven, and the efficiency and voltage ripple characteristics according to the load current are obtained.

When comparing the efficiencies between the related art and the present invention, it can be seen that when the conventional DC-DC converter operates at a single sampling frequency of 7.5 MHz, the efficiency abruptly decreases in the load current less than 10 mA. On the other hand, the buck DC-DC converter according to the present invention uses a sampling frequency of 3.75 MHz for a load current of 20 mA or less, and in this case, the efficiency does not abruptly decrease even in the case of the load current becoming 10 mA or less.

In detail, at the sampling frequency of 3.75 MHz for a load current of 20 mA or less, the buck DC-DC converter according the present invention has 20% or more of improvement in the power efficiency compared to the related art in which a sampling frequency of 7.5 MHz is used. Upon studying the ripple characteristics of the output voltage while changing the sampling frequencies from 3.75 MHz to 7.5 MHz and to 15.0 MHz, it can be seen that the ripple of the output voltage decreases as the sampling frequency becomes higher. In addition, considering that the ripple of the output voltage at a light load current is shown to be less than 25 mV, it can be seen that stable performance is obtained. In addition, the range of operable load currents is from 0.1 mA to 1500 mA, which is ten or more times larger than that of the related art.

Figure 10:
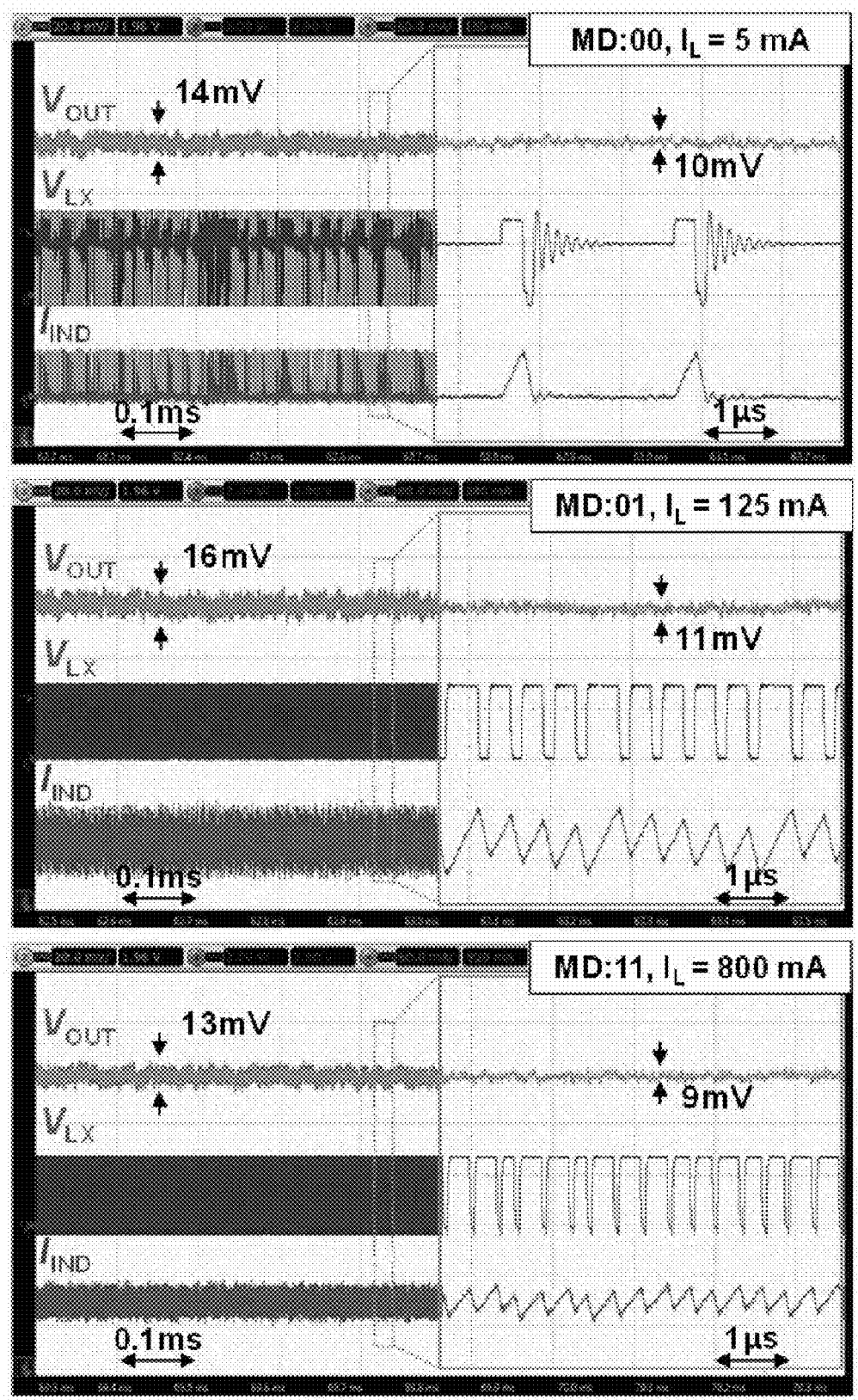
FIG. 10 is a diagram showing an output waveform of a switched-mode power supply (a buck DC-DC converter) using a reconfigurable DSM according to an example embodiment of the present invention.

FIG. 10 is a diagram showing an output waveform of a switched-mode power supply (a buck DC-DC converter) using a reconfigurable DSM according to an example embodiment of the present invention.

Referring FIG. 10, a result of checking the operation stability while changing the order of the reconfigurable DSM and the sampling frequency in each mode of the switched-mode power supply using the reconfigurable DM according to the example embodiment of the present invention is shown.

It can be seen that the output voltage remains constant and stable operation is secured even when the sampling frequency is changed while changing the order of the reconfigurable DSM from the second order to the third order or from the third order to the second order. In addition, as the sampling frequency becomes higher, the ripple of the output voltage decreases. It can be seen that stability of driving is secured even when the sampling frequency becomes higher.

Figure 11:
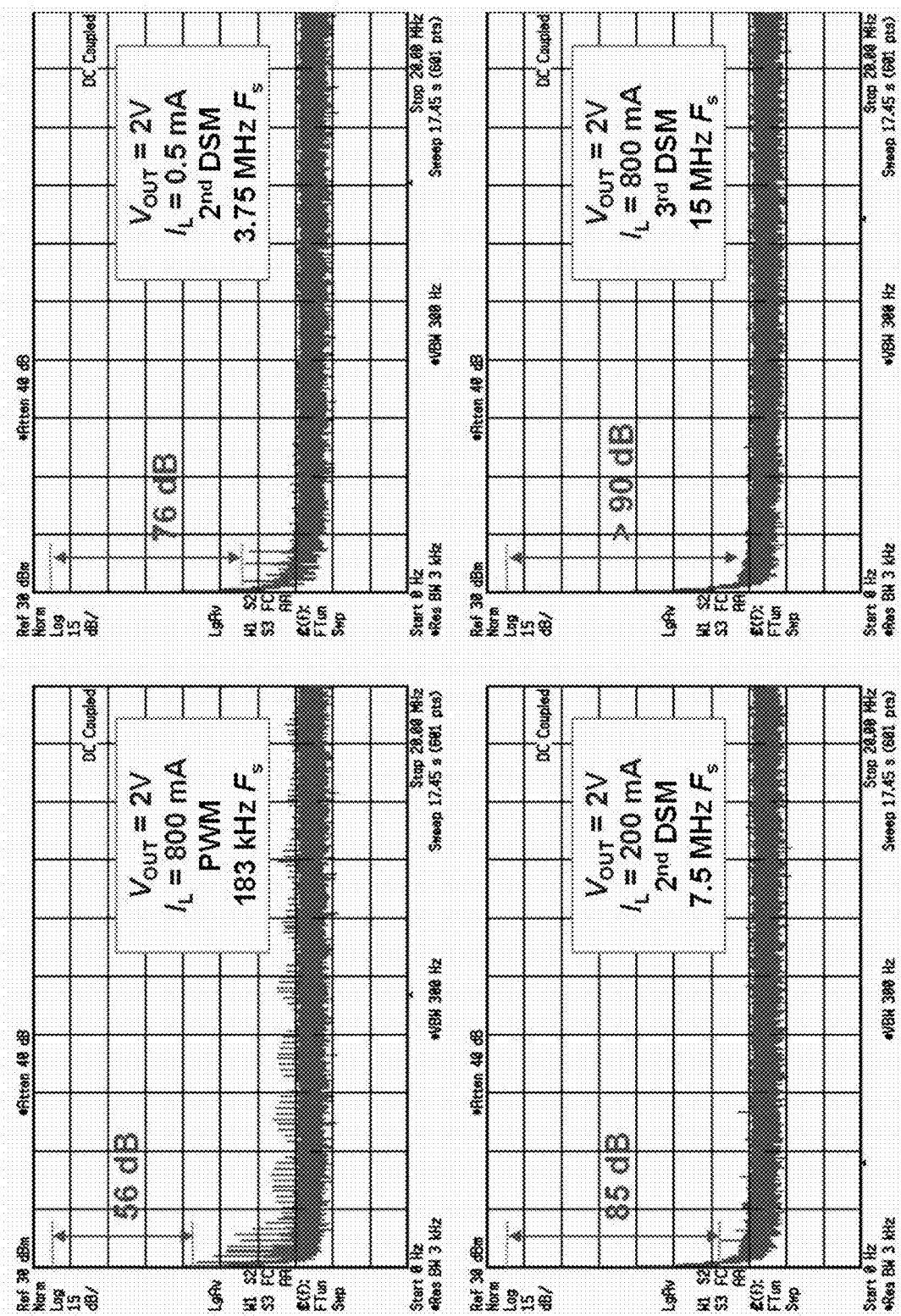
FIG. 11 is a view showing frequency characteristics of a switched-mode power supply (a buck DC-DC converter) using a reconfigurable DSM according to example embodiments of the present invention.

FIG. 11 is a view showing frequency characteristics of a switched-mode power supply (a buck DC-DC converter) using a reconfigurable DSM according to example embodiments of the present invention.

Referring to FIG. 11, the frequency characteristics of the output voltage according to a change in the order (between the second order and the third order) of the loop filter according to the present invention are compared with the frequency characteristics of the output voltage according to the related art.

Referring to the output waveform shown in the upper left side of FIG. 11, it can be seen that the conventional DC-DC converter using the PWM method has a large frequency harmonic occurring at a multiple of the PWM operating frequency. For example, when the load current is 800 mA, the PWM frequency is 183 KHz, and when the output voltage is 2 V, the frequency characteristics of the output voltage show large harmonics occurring at frequencies corresponding to multiples of 183 KHz. Such a frequency harmonic results in the DC-DC converter having an output gain of 56 dB, exhibiting low efficiency.

Referring to the upper right side of FIG. 11, which shows the output voltage waveform of the switched-mode power supply using a reconfigurable DSM according to the example embodiment of the present invention, it can be seen that the frequency harmonic of the output voltage is prevented in the entire frequency band when the load current is 0.5 mA, the switching frequency is 3.75 MHz, the output voltage is 2 V, the reconfigurable DSM operates with a second-order loop filter, and the dual mode compensator is driven with DCM compensation. As the output voltage has an improved frequency harmonic characteristic, the output gain of the DC-DC converter is improved to 76 dB. It can be seen that the output gain is improved by 20 dB compared to the conventional DC-DC converter using the PWM method.

Referring to the lower left side of FIG. 11, which shows the output voltage waveform of a switched-mode power supply using a reconfigurable DSM according to another example embodiment of the present invention, it can be seen that the frequency harmonic of the output voltage is prevented in the entire frequency band when the load current is 200 mA, the switching frequency is 7.50 MHz, the output voltage is 2 V, the reconfigurable DSM operates with a second-order loop filter, and the dual mode compensator driven with DCM or CCM compensation. As the output voltage has an improved frequency harmonic characteristic, the output gain of the DC-DC converter is improved to 85 dB. It can be seen that the output gain is improved by 29 dB compared to the conventional DC-DC converter using the PWM method. Upon comparison of the cases of each having a switching frequency of 3.75 MHz and 7.50 MHz, it can be seen that as the frequency becomes higher, the ripples and frequency harmonics of the output voltage decrease, and the output efficiency is improved.

Referring to the lower right side of FIG. 11, which shows the output voltage waveform of a switched-mode power supply using a reconfigurable DSM according to still another example embodiment of the present invention, it can be seen that the frequency harmonic of the output voltage is prevented in the entire frequency band when the load current is 800 mA, the switching frequency is 15.0 MHz, the output voltage is 2 V, the reconfigurable DSM operates with a third-order loop filter, and the dual mode compensator is driven with CCM compensation. As the output voltage has an improved frequency harmonic characteristic, the output gain of the DC-DC converter is improved to 90 dB. It can be seen that the output gain is improved by 34 dB compared to the conventional DC-DC converter using the PWM method. Upon comparison of the cases of each having a switching frequency of 3.75 MHz, 7.50 MHz, and 15.0 MHz, it can be seen that as the frequency becomes higher, the ripples and frequency harmonics of the output voltage decrease, and the output efficiency is improved.

In particular, when the load current is 800 mA, the sampling frequency is 15.0 MHz, the reconfigurable DSM operates with a third-order loop filter, and the dual mode compensator is driven with CCM compensation, it can be confirmed that the spur generated from using the conventional PWM method is removed by 95% or more.

The switched-mode power supply using a reconfigurable DSM according to the embodiments of the present invention and the method of driving the same may increase the range of operable load currents by driving the power switch with the output of the reconfigurable DSM.

In addition, the stability and power efficiency of the entire loop of the DC-DC converter may be increased by employing a second-order loop filter DSM for the light load (low load) current and a third-order loop filter DSM for the heavy load (high load) current according to the change in the load current.

In addition, the output voltage ripple across the entire range of loads (light load current, medium load current, and heavy load current) can be reduced by changing the sampling frequency and order of the DSM according to the current value of the output terminal (the inductor).

In addition, operation in a wide range of sampling frequencies may be secured by reconfiguring a second-order loop filter or a third-order loop filter using a single operational amplifier resonating circuit.

In addition, switches may be added to the inside of the RC circuit of the loop filter and the switches may be controlled to be turned ON/OFF so as to change the order of the loop filter.

In addition, transfer functions used for the compensator vary according to the operation mode of the DSM, and different transfer functions are applied depending on a CCM and a DCM such that stable loop characteristics may be obtained.

The methods according to the present invention may be implemented in the form of program commands executable by various computer devices and may be recorded in a computer-readable storage media. The computer-readable storage media may include program commands, data files, data structures, and the like alone, or a combination thereof. The program commands recorded in the computer-readable storage media may be specially designed and constructed for the present invention, or may be well known and available to those of ordinary skill in the field of computer software.

Examples of the computer-readable storage medium include a hardware device constructed to store and execute a program command, for example, a read-only memory (ROM), a random-access memory (RAM), and a flash memory. The program command may include a high-level language code executable by a computer through an interpreter in addition to a machine language code made by a compiler. The described hardware devices may be configured to act as one or more software modules in order to perform the operations of the present invention, or vice versa.

While the example embodiments of the present invention and their advantages have been described in detail, it should be understood that various changes, substitutions and alterations may be made herein without departing from the scope of the present invention.

What is claimed is:

1. A switched-mode power supply using a reconfigurable delta-signal modulator (DSM), the switched-mode power supply comprising:
 a current sensing unit configured to determine an operation mode on the basis of a result of sensing a current of an output terminal;
 a compensator configured to output a compensation signal by amplifying a difference value between an output voltage and a reference voltage;
 a reconfigurable DSM configured to output a digital signal by noise-shaping the compensation signal;
 a power switch unit switched by the digital signal to output an output voltage; and
 an attenuator configured to supply a feedback voltage of the output voltage attenuated by a voltage divider to the compensator,
 wherein the reconfigurable DSM changes an order of a loop filter according to a magnitude of a load current.

2. The switched-mode power supply of claim 1, wherein the reconfigurable DSM is configured to:
 operate such that the order of the loop filter is set to a second order when the load current is a first load current smaller than a reference value;
 operate such that the order of the loop filter is set to the second order or a third order when the load current is a second load current larger than the first load current; and operate such that the order of the loop filter is set to the third order when the load current is a third load current larger than the second load current.

3. The switched-mode power supply of claim 2, wherein the reconfigurable DSM is configured to:
use a first sampling frequency for the first load current;
use a second sampling frequency higher than the first sampling frequency for the second load current; and
use a third sampling frequency higher than the second sampling frequency for the third load current.

4. The switched-mode power supply of claim 2, wherein the current sensing unit is configured to:
determine a discontinuous conduction mode (DCM) compensation when the sensed current is the first load current smaller than the reference value;
determine a continuous conduction mode (CCM) compensation or the DCM compensation when the sensed current is the second load current corresponding to the reference value; and
determine the CCM compensation when the sensed current is the third load current larger than the reference value.

5. The switched-mode power supply of claim 4, wherein the compensator is configured to:
perform the DCM compensation in response to the first load current;
perform the DCM compensation or the CCM compensator in response to the second load current; and
perform the CCM compensator in response to the third load current.

6. The switched-mode power supply of claim 2, wherein the loop filter comprises:
a first integrator, a second integrator, and a third integrator which are connected in series;
a first switch disposed parallel to the first integrator; and
a second switch disposed on a loop for feedforwarding an output of the first integrator to an output of the third integrator.

7. The switched-mode power supply of claim 6, wherein, when the order of the loop filter is set to the third order, a transfer function TF3 having three poles and two zeros is derived.

8. The switched-mode power supply of claim 7, wherein, when the order of the loop filter is set to the third order,
an output coefficient of the first integrator is fed forward to be summed with outputs of the second and the third integrators, and
a final output is fed back to be subtracted from the output of the first integrator.

9. The switched-mode power supply of claim 6, wherein a third-order loop filter is converted into a second-order loop filter by turning on the first switch to remove the first integrator and turning off the second switch to remove the loop for feedforwarding.

10. The switched-mode power supply of claim 9, wherein, when the order of the loop filter is set to the second order, the loop filter is configured with two integrators, one feedforward loop, and one feedback loop, and a transfer function having two poles and one zero is derived.

11. The switched-mode power supply of claim 1, wherein the loop filter includes:
a first capacitor, a second capacitor, and third capacitors which are connected in series;
an operational amplifier connected parallel to the first to third capacitors;
a first inverting circuit configured to inverse and output a signal of an input terminal;
a second inverting circuit configured to inverse and output an output signal of the operational amplifier;
a first resistor arranged between the input terminal and a first terminal of the first capacitor;
a second resistor having a first terminal connected to a first node formed between the first capacitor and the second capacitor and a second terminal connected to a ground;
a third resistor having a first terminal connected to a second node formed between the second capacitor and the third capacitor and a second terminal connected to the ground;
a fourth resistor having a first terminal connected to the first node and a second terminal connected to an output terminal of the operational amplifier;
a fifth resistor connected parallel to the third capacitor;
a sixth resistor having a first terminal connected to an output terminal of the first inverting circuit and a second terminal connected to the first node;
a seventh resistor having a first terminal connected to a third node and a second terminal connected to the second node;
a first switch arranged between the second terminal of the sixth resistor and the first node;
a second switch arranged between the seventh resistor and the second node;
a third switch connected parallel to the first capacitor; and
a fourth switch arranged between the second resistor and the first node.

12. The switched-mode power supply of claim 11, wherein the loop filter operates as a third-order loop filter by turning on the first switch, the second switch, and the fourth switch and turning off the third switch.

13. The switched-mode power supply of claim 11, wherein the loop filter operates as a second-order loop filter by turning off the first switch, the second switch, and the fourth switch and turning on the third switch.

14. The switched-mode power supply of claim 1, wherein the compensator comprises:
an operational amplifier including a first input terminal (−) and a second input terminal (+);
a first resistor having a first terminal connected to a feedback input terminal and a second terminal connected to the first input terminal of the operational amplifier;
a first capacitor having a first terminal connected to the feedback input terminal and a second terminal connected to the first input terminal of the operational amplifier;
a first switch arranged between the feedback input terminal and the first capacitor;
a second resistor connected in series to the first resistor and the first capacitor;
a third resistor connected in series to the second resistor;
a second switch connected parallel to the third resistor; and
a second capacitor having a first terminal connected to the third resistor and a second terminal connected to an output terminal of the operational amplifier.

15. The switched-mode power supply of claim 14, wherein the compensator operates in a CCM by turning on the first and second switches.

16. The switched-mode power supply of claim 14, wherein the compensator operates in a DCM by turning off the first and second switches.

17. A driving method performed in a switched-mode power supply, the driving method comprising:

compensating for a signal in a continuous conduction mode (CCM) or a discontinuous conduction mode (DCM) according to a magnitude of a load current, and outputting a compensation signal;

changing an order of a loop filter according to the magnitude of load current, and outputting a digital signal obtained by noise-shaping the compensation signal using the loop filter; and outputting an output voltage on the basis of the digital signal.

18. The driving method of claim 17, wherein:

the order of the loop filter is set to a second order when the load current is a first load current smaller than a reference value;

the order of the loop filter is set to a second order or third order when the load current is a second load current larger than the first load current; and the order of the loop filter is set to the third order when the load current is a third load current larger than the second load current.

19. The driving method of claim 18, wherein:

a first sampling frequency is used for the first load current;

a second sampling frequency higher than the first sampling frequency is used for the second load current; and a third sampling frequency higher than the second sampling frequency is used for the third load current.

20. The driving method of claim 18, wherein:

a DCM compensation is used in response to the first load current;

the DCM or a CCM compensation is used in response to the second load current; and the CCM compensation is used in response to the third load current.

* * * * *